United States Patent
Li (10) Patent No.: US 8,860,134 B1
(45) Date of Patent: Oct. 14, 2014

(54) TRENCH POWER DEVICE AND MANUFACTURING METHOD THEREOF

(71) Applicant: Sinopower Semiconductor, Inc., Hsinchu (TW)

(72) Inventor: Po-Hsien Li, Tainan (TW)

(73) Assignee: Sinopower Semiconductor, Inc., Hsinchu (TW)

( * ) Notice: Subject to any disclaimer, the term of this patent is extended or adjusted under 35 U.S.C. 154(b) by 0 days.

(21) Appl. No.: 14/016,444

(22) Filed: Sep. 3, 2013

(30) Foreign Application Priority Data

Jun. 7, 2013 (TW) .............................. 102120293 A (51) Int. Cl.
*H01L 29/78* (2006.01)

(52) U.S. Cl.
USPC ........... 257/335; 257/330; 257/341; 257/401; 257/E29.245

(58) Field of Classification Search
USPC ......... 257/328–332, 335, 341, 401, 500–502, 257/E29.245
See application file for complete search history.

(56) References Cited

U.S. PATENT DOCUMENTS

| | | | |
|---|---|---|---|
| 7,745,878 B2* | 6/2010 | Bhalla et al. ................ | 257/330 |
| 8,138,605 B2* | 3/2012 | Chang et al. ................ | 257/751 |
| 2009/0212358 A1* | 8/2009 | Shiraishi et al. ............ | 257/330 |
| 2010/0173445 A1* | 7/2010 | Danzer et al. ............... | 438/69 |
| 2011/0312138 A1* | 12/2011 | Yedinak et al. ............. | 438/270 |
| 2012/0083083 A1* | 4/2012 | Hshieh ......................... | 438/270 |
| 2012/0262692 A1* | 10/2012 | Bridges et al. .............. | 356/3.1 |
| 2013/0268080 A1* | 10/2013 | Melkent et al. ............. | 623/17.16 |
| 2013/0323921 A1* | 12/2013 | Burke et al. ................. | 438/589 |
| 2014/0131792 A1* | 5/2014 | Siemieniec et al. ......... | 257/330 |

* cited by examiner

*Primary Examiner* — Thanh Nguyen
(74) *Attorney, Agent, or Firm* — Rosenberg, Klein & Lee (57) ABSTRACT

A trench power device includes a semiconductor layer, a trench gate structure, a trench source structure, and a contact. The semiconductor layer has an epitaxial layer, a doped body region, a S/D region, and a doped contact-carrying region. The doped body region is formed in the epitaxial layer, the S/D region is formed in the doped body region, and the doped contact-carrying region is formed in the doped body region and outside a projecting portion defined by orthogonally projecting from the S/D region to the doped body region. The trench gate structure is embedded in the S/D region, the doped body region, and the epitaxial layer. The trench source structure is embedded in the doped body region and the epitaxial layer, and is connected to the doped contact-carrying region. The contact is connected to the S/D region and the doped contact-carrying region.

7 Claims, 8 Drawing Sheets

TRENCH POWER DEVICE AND MANUFACTURING METHOD THEREOF

BACKGROUND OF THE INVENTION

1. Field of the Invention

The instant disclosure relates to a semiconductor device; more particularly, to a trench power device and a manufacturing method thereof

2. Description of Related Art

The power device is used to manage power, and the type of power device includes metal-oxide-semiconductor thin film transistor (MOSFET), bipolar junction transistor (BJT), and insulated gate bipolar transistor (IGBT). The MOSFET is widely applied because the MOSFET is capable of saving energy and faster switching rate.

The conventional type of MOSFET includes a thick bottom oxide structure and split gate structure, and they have some problems, which need to improve. For example, $C_{iss}/C_{rss}$ of the thick bottom oxide structure is about 13 and can be further improved. The split gate structure has difficult manufacturing process because the oxide layer of semiconductor layer is hard to be controlled for separating the gate from the source.

To achieve the abovementioned improvement, the inventors strive via industrial experience and academic research to present the instant disclosure, which can provide additional improvement as mentioned above.

SUMMARY OF THE INVENTION

One embodiment of the instant disclosure provides a trench power device and a manufacturing method thereof for having better efficacy and easily manufacturing the trench power device.

The trench power device in the instant disclosure comprises: a base defining a cell area, a terminal area, and a channel stop area, the terminal area arranged between the cell area and the channel stop area, wherein the base includes a substrate and a semiconductor layer formed on the substrate, and the semiconductor layer comprises: an epitaxial layer disposed on the substrate, the conductivity type of the epitaxial layer identical to the conductivity type of the substrate; a doped body region connected to the epitaxial layer, the doped body region arranged in the cell area and away from the substrate, the conductivity type of the doped body region different from the conductivity type of the epitaxial layer; a S/D region connected to the doped body region, the S/D region arranged in the cell area and away from the substrate; and a doped contact-carrying region having a periphery portion connected to the doped body region and an intermediate portion non-connected to the doped body region, the doped contact-carrying region approximately arranged outside a projecting portion defined by orthogonally projecting from the S/D region to the doped body region; a trench gate structure embedded in the semiconductor layer arranged in the cell area, the trench gate structure passing through the S/D region and the doped body region and extended into the epitaxial layer; a trench source structure embedded in the semiconductor layer arranged in the cell area, the trench source structure arranged apart from the trench gate structure, the trench source structure passing through the doped body region and extended into the epitaxial layer, wherein a top portion of the trench source structure away from the substrate is connected to the intermediate portion of the doped contact-carrying region, the depth of the trench source structure in reference to the epitaxial layer is greater than the depth of the trench gate structure in reference to the epitaxial layer; and a contact at least partially arranged in a space jointly defined by the S/D region and the doped contact-carrying region, the contact connected to the S/D region and the doped contact-carrying region; wherein the electric potential of the S/D region in reference to the contact is identical to the electric potential of the doped body region in reference to the contact via the doped contact-carrying region, and the electric potential of the S/D region in reference to the contact is identical to the electric potential of the trench source structure in reference to the contact via the doped contact-carrying region.

The manufacturing method of the trench power device in the instant disclosure comprises: providing a base, wherein the base includes a substrate and a semiconductor layer formed on the substrate, the conductivity type of the semiconductor layer is identical to the conductivity type of the substrate; etching the semiconductor layer to form a shallow trench; forming a first insulating layer on a top surface of the semiconductor layer and an inner wall of the shallow trench, wherein a portion of the first insulating layer connected to the inner wall of the shallow trench is defined as a gate insulating layer; depositing a gate conductive layer in a space surroundingly defined by the gate insulating layer; etching the semiconductor layer to form a deep trench; forming a second insulating layer on a top surface of the first insulating layer and an inner wall of the deep trench, and forming a source conductive layer to embed in the second insulating layer, wherein a portion of the second insulating layer connected to the inner wall of the deep trench is defined as a source insulating layer, the source conductive layer is arranged in a space surroundingly defined by the source insulating layer; implementing an ion implanting process on the semiconductor layer to form a doped body region by inwardly diffusing from the top surface of the semiconductor layer, wherein the conductivity type of the doped body region is different from the conductivity type of the substrate, the doped body region is connected to part of the gate insulating layer and part of the source insulating layer; implementing an ion implanting process on the doped body region to form a S/D region by inwardly diffusing from a top surface of the doped body region, wherein the S/D region is connected to part of the gate insulating layer; etching the semiconductor layer to form a contact slot for exposing the corresponding doped body region, the corresponding S/D region, the corresponding source conductive layer, and the corresponding source insulating layer via the contact slot; implementing an ion implanting process on a bottom wall of the contact slot to form a doped contact-carrying region, wherein the doped contact-carrying region is connected to the doped body region, the source conductive layer, and the source insulating layer; and depositing a contact in the contact slot, wherein the contact is connected to the doped contact-carrying region and the S/D region.

In summary, the trench power device of the instant disclosure can be prepared by the manufacturing method of the trench power device. The trench power device of the instant disclosure has better performance and easier to be manufactured than the conventional power device by the trench gate structure and the trench source structure in parallel arrangement, the depth of the trench source structure greater than the depth of the trench gate structure, and the equipotential doped body region, source conductive layer, and S/D region with respect to the corresponding contact.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

First Embodiment

Please refer to FIGS. 1 through 10, which show a first embodiment of the instant disclosure. References are hereunder made to the detailed descriptions and appended drawings in connection with the instant disclosure. However, the appended drawings are merely shown for exemplary purposes, rather than being used to restrict the scope of the instant disclosure.

Figure 1:
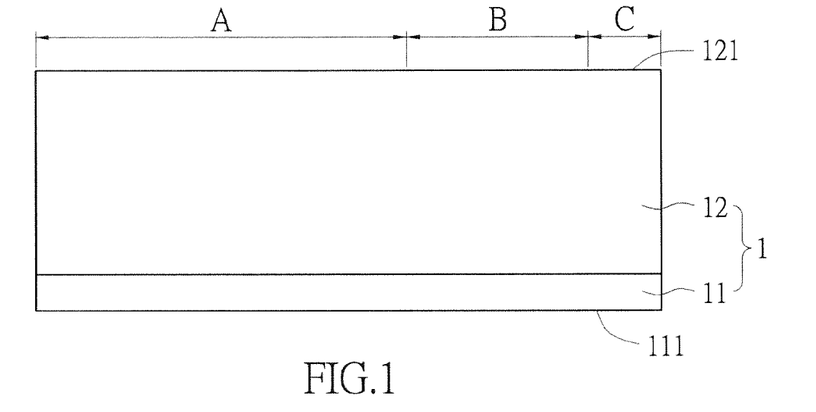
FIG. 1 is a cross-sectional view of a manufacturing, method of a trench power device according to the step S100 of a first embodiment of the instant disclosure.

The instant embodiment discloses a manufacturing method of a trench power device firstly for conveniently understanding the instant embodiment. The instant embodiment takes an unit portion of the trench power device for example, and explaining the trench power device by the cross-sectional view of the unit portion. Please refer to the figure corresponding to each step, and with reference occasionally made to the other figures. The manufacturing method of the trench power device includes a plurality of steps S100~S190 as follows:

Step S100: as shown in FIG. 1, providing a platy base 1 having a first surface 111 and an opposite second surface 121. The base 1 defines a cell area A, a terminal area B, and a channel stop area C, and the terminal area B is arranged between the cell area A and the channel stop area C.

Moreover, the base 1 includes a platy substrate 11 and a semiconductor layer 12 formed on the substrate 11. The bottom surface of the substrate 11 is the first surface 111, and the top surface of the semiconductor layer 12 is the second surface 121. The conductivity type of substrate 11 is $N^+$ type or $P^+$ type. The semiconductor layer 12 is formed by the epitaxial process, and the conductivity type of the semiconductor layer 12 is identical to the conductivity type of the substrate 11 ($N^+$ type or $P^+$ type). In the instant embodiment, the conductivity type of the substrate 11 is $N^+$ type, the conductivity type of the semiconductor layer 12 is $N^-$ type, and the doped concentration of the substrate 11 is greater than the doped concentration of the semiconductor layer 12.

Figure 2:
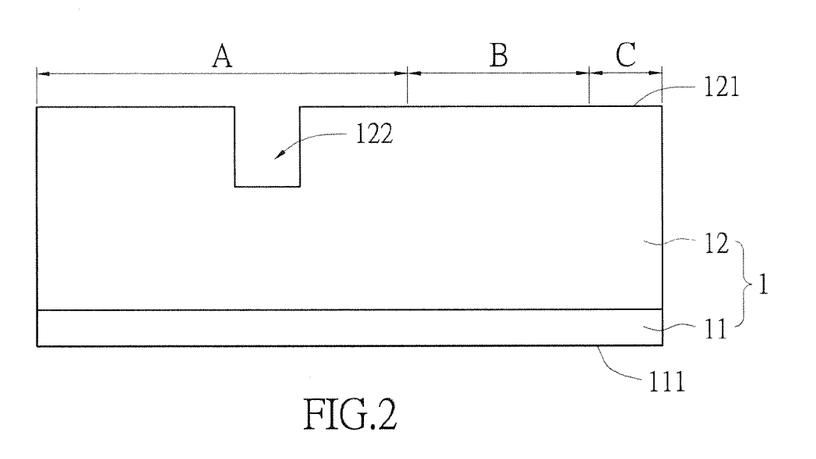
FIG. 2 is a cross-sectional view of the manufacturing method of the trench power device according to the step S110 of the first embodiment of the instant disclosure.

Step S110: as shown in FIG. 2, etching the cell area A of the semiconductor layer 12 to form a shallow trench 122. The depth of the shallow trench 122 in the instant embodiment, which is a distance between the bottom wall of the shallow trench 122 and the second surface 121, is approximately 1.0 μm to 1.5 μm.

Figure 3:
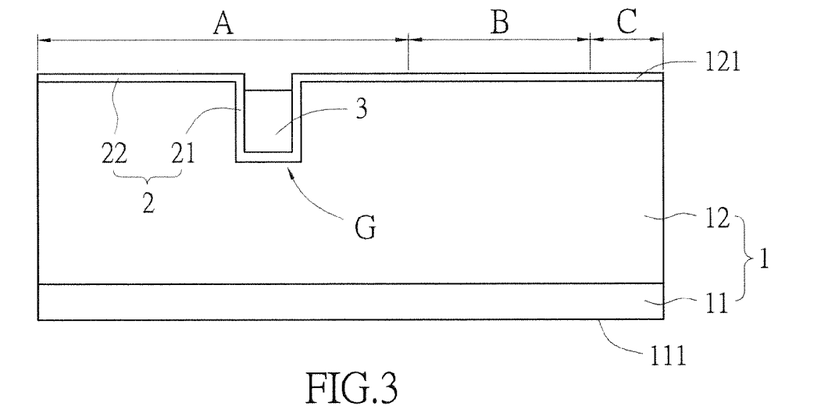
FIG. 3 is a cross-sectional view of the manufacturing method of the trench power device according to the step S120 of the first embodiment of the instant disclosure.

Step S120: as shown in FIG. 3, forming a first insulating layer 2 on the top surface of the semiconductor layer 122 (i.e., the second surface 121) and an inner wall of the shallow trench 122 (i.e., the side wall and the bottom wall of the shallow trench 122). The thickness of the first insulating layer 2 in the instant embodiment is 0.045 μm to 0.06 μm. A portion of the first insulating layer 2 connected to the inner wall of the shallow trench 122 is defined as a gate insulating layer 21, and the other portion of the first insulating layer 2 is defined as a first covering layer 22. The first insulating layer 2 can be made of silicon-oxygen compound or the other suitable dielectric material.

After that, depositing a gate conductive layer 3 in a space surroundingly defined by the gate insulating layer 21, and an exposed surface of the gate conductive layer 3 (i.e., the top surface of the gate conductive layer 3 as shown in FIG. 3) is lower than the second surface 121 of the substrate 1 in reference to the first surface 111 by etching back. The gate insulating layer 21 and the gate conductive layer 3 are jointly defined as a trench gate structure G. Moreover, the distance between the exposed surface of the gate conductive layer 3 and the second surface 121 of the substrate 1 in the instant embodiment is approximately 0.1 μm to 0.15 μm. The gate conductive layer 3 is made of doped poly-silicon, but is not limited thereto.

Figure 4:
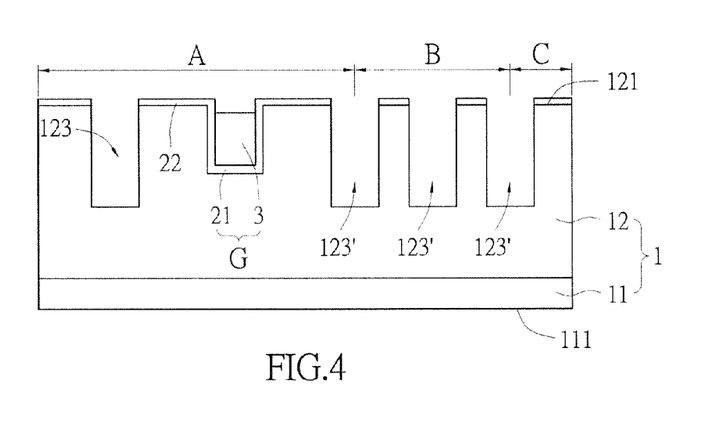
FIG. 4 is a cross-sectional view of the manufacturing method of the trench power device according to the step S130 of the first embodiment of the instant disclosure.

Step S130: as shown in FIG. 4, etching the first covering layer 22 and the semiconductor layer 12 to form a plurality of deep trenches 123, 123' respectively arranged on two opposite sides of the shallow trench 122 (i.e., the left side and the right side of the shallow trench 122). Specifically, about two of the deep trenches 123, 123', which are adjacent to the shallow trench 122, one deep trench 123 is entirely arranged in the cell area A of the semiconductor layer 12, and another deep trench 123' is partially arranged in the cell area A of the semiconductor layer 12 (i.e., the left-half portion of the deep trench 123' as shown in FIG. 4). The depth of each deep trench 123, 123' (i.e., the distance between the bottom wall of each deep trench 123, 123' and the second surface 121) is greater than the depth of the shallow trench 122, and the depth of each deep trench 123, 123' in the instant embodiment is approximately 1.2 μm to 2.5 μm.

Additionally, the above deep trenches 123, 123' are disclosed according to the cross-sectional views, so that the deep trenches 123, 123' may be separated with each other. However, when the above deep trenches 123, 123' in a three dimensional view, the deep trenches 123, 123' may be separated with each other or communicated with each other, the instant embodiment is not limited thereto.

Figure 5:
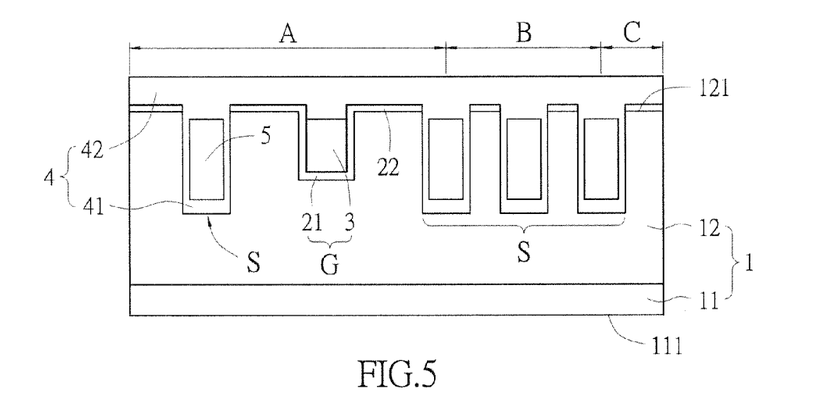
FIG. 5 is a cross-sectional view of the manufacturing method of the trench power device according to the step S140 of the first embodiment of the instant disclosure.

Step S140: as shown in FIG. 5, forming a second insulating layer 4 on the top surface of the first insulating layer 2 (i.e., the top surface of the first covering layer 22) and an inner wall of each deep trench 123, 123' (i.e., the bottom wall and the side wall of each deep trench 123, 123'). A portion of the second insulating layer 4 connected to the inner wall of each deep trench 123, 123' is defined as a source insulating layer 41, and the other portion of the second insulating layer 4 is defined as a second covering layer 42.

The thickness of the second insulating layer 4 is greater than the thickness of the first insulating layer 2. The thickness of the source insulating layer 41 in the instant embodiment is approximately 0.08 μm to 0.2 μm. The thickness of the bottom portion of each source insulating layer 41 connected to the bottom wall of corresponding deep trench 123, 123' is greater than the thickness of the side portion of each source insulating layer 41 connected to the side wall of corresponding deep trench 123, 123'. The second insulating layer 4 is formed by low temperature oxide (LTO) deposition, until the thickness of second insulating layer 4 is about 0.08 μm to 0.2 μm. The permittivity of the second insulating layer 4 is substantially identical to the permittivity of the first insulating layer 2.

And then, depositing a source conductive layer 5 in a space surroundingly defined by each source insulating layer 41, and an exposed surface of the source conductive layer 5 (i.e., the top surface of the source conductive layer 5 as shown in FIG. 5) is lower than the second surface 121 of the substrate 1 in reference to the first surface 111 by etching back. The source insulating layer 41 and the source conductive layer 5 are jointly defined as a trench source structure S. Moreover, the distance between the exposed surface of the source conductive layer 5 and the second surface 121 of the substrate 1 in the instant embodiment is approximately 0.1 μm to 0.15 μm. The source conductive layer 5 is made of doped poly-silicon, but is not limited thereto.

After that, depositing insulating material for increasing the thickness of the second covering layer 42 and embedding the source conductive layer 5 in the second covering layer 42, and then implanting the Chemical Mechanical Polishing (CMP) to planarize the second covering layer 42.

Figure 6:
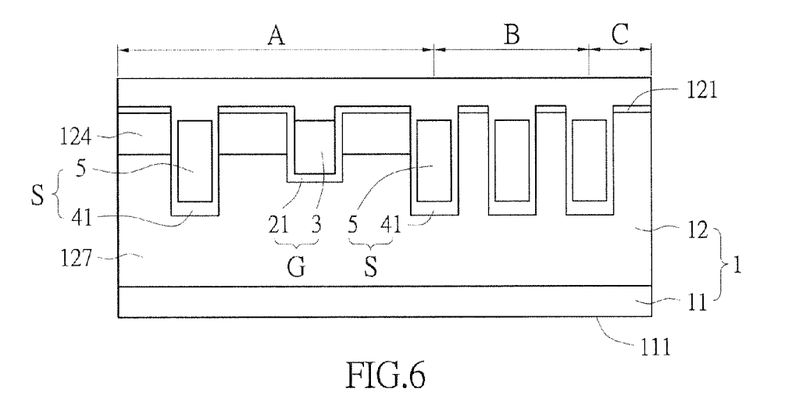
FIG. 6 is a cross-sectional view of the manufacturing method of the trench power device according to the step S150 of the first embodiment of the instant disclosure.

Step S150: as shown in FIG. 6, implementing an ion implanting process on the cell area A of the semiconductor layer 12 to form a doped body region 124 by inwardly diffusing from the top surface (i.e., the second surface 121) of the semiconductor layer 12. The doped body region 124 is approximately arranged around an upper part of the gate insulating layer 21 and an upper part of the source insulating layers 41. Specifically, The depth of the doped body region 124 (i.e. the distance between the bottom surface of the doped body region 124 and the second surface 121) is less than the depth of the gate conductive layer 3 (i.e., the distance between the bottom surface of the gate conductive layer 3 and the second surface 121). The doped body region 124 is connected to the upper part of the gate insulating layer 21 and the upper part of the source insulating layer 41.

Moreover, the conductivity type of the doped body region 124 is different from the conductivity type of the substrate 11. The conductivity type of doped body region 124 in the instant embodiment is P type, and the implanted ion is $B^+$. The semiconductor layer 12 excluding the doped body region 124 is defined as an epitaxial layer 127.

Additionally, the implanted ion of the implanting process in the instant embodiment can be adjusted. For example, the implanted ion can be $Zn^{2+}$, $F^-$, $N^-$, $O^{2-}$, $C^{4+}$, $Ar^+$, $P^+$, $As^+$, or $Sb^{2+}$.

Figure 7:
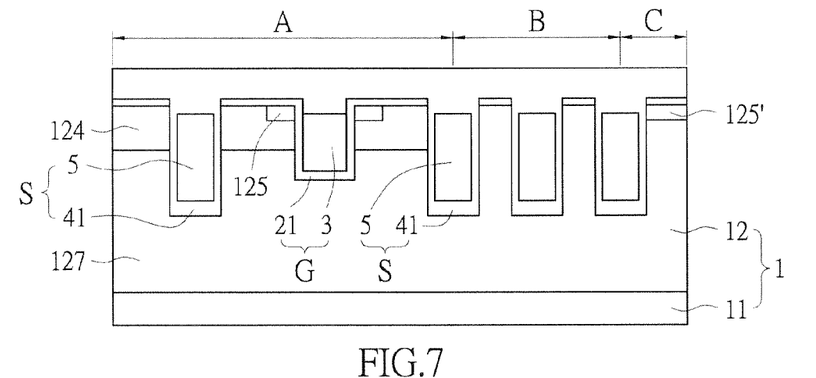
FIG. 7 is a cross-sectional view of the manufacturing method of the trench power device according to the step S160 of the first embodiment of the instant disclosure.

Step S160: as shown in FIG. 7, implementing an ion implanting process on the doped body region 124 to form a S/D region 125 and on the channel stop area C of the semiconductor layer 12 to form a S/D region 125'. The S/D region 125 is formed by inwardly diffusing from a top surface of the doped body region 124, and the S/D region 125 is connected to a top part of the gate insulating layer 21. The S/D region 125 is separated from the adjacent source insulating layer 41 and the adjacent epitaxial layer 127 by the doped body region 124. Moreover, the implanted ion of the instant implanting process to form the S/D regions 125. 125' is $As^+$.

Figure 8:
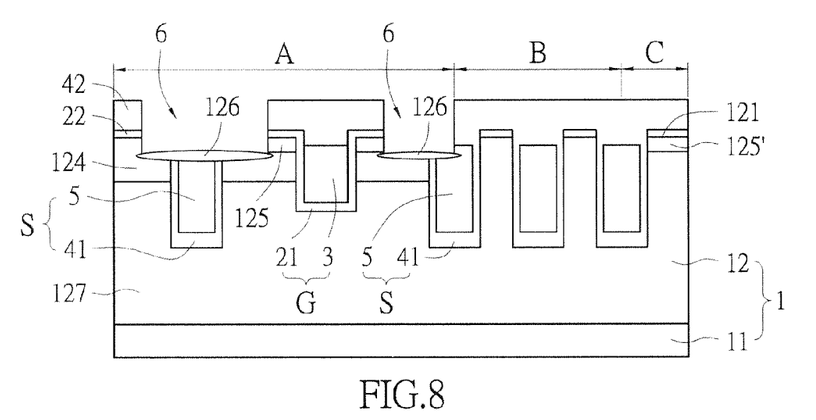
FIG. 8 is a cross-sectional view of the manufacturing method of the trench power device according to the step S170 of the first embodiment of the instant disclosure.

Step S170: as shown in FIG. 8, etching the cell area A of the semiconductor layer 12 to form two contact slots 6 by removing part of the second insulating layer 4, part of the first covering layer 22, part of the doped body region 124 and part of the source conductive layer 5, thereby exposing the corresponding doped body region 124, the corresponding S/D region 125, the corresponding source conductive layer 5, and the corresponding source insulating layer 41 via the contact slots 6.

Specifically, in the cell area A, the step S170 is etching from two opposite sides of a portion of the second covering layer 42, in which the portion is located above the S/D region 125, the gate insulating layer 21, and the gate conductive layer 3. Moreover, the depth of each contact slot 6 is lower than the top surface of the gate conductive layer 3 (and the source conductive layer 5). That is to say, the distance between the bottom wall of each contact slot 6 and the second surface 121 is greater than the distance between the top surface of the gate conductive layer 3 and the second surface 121. The depth of each contact slot 6 in the instant embodiment is approximately 0.25 μm to 0.35 μm.

After that, implementing an ion implanting process on the bottom wall of each contact slot 6 to form a doped contact-carrying region 126. The implanted ion of the Step S170 to from each doped contact-carrying region 126 is $BF_2^+$.

Figure 9:
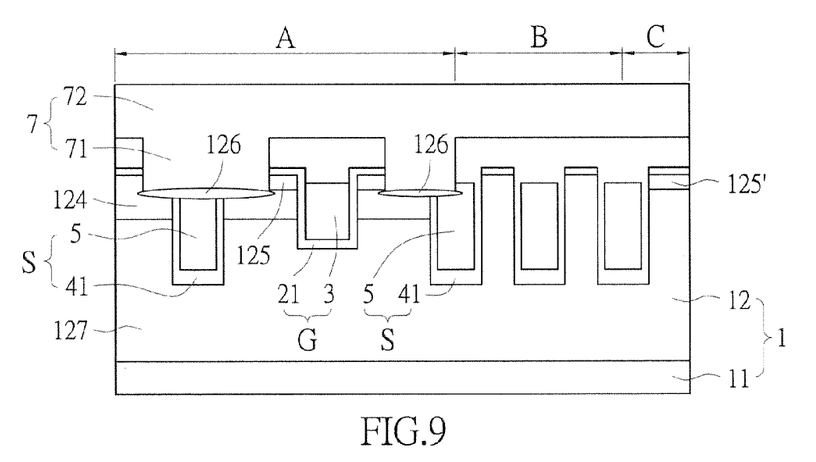
FIG. 9 is a cross-sectional view of the manufacturing method of the trench power device according to the step S180 of the first embodiment of the instant disclosure.

Step S180: as shown in FIG. 9, depositing a metallic layer 7 on the contact slots 6 and the second covering layer 42, and then planarizing the metallic layer 7. A portion of the metallic layer 7 arranged in each contact slot 6 and connected to the corresponding doped contact-carrying region 126 is defined as a contact 71. Thus, in the cell area A, the doped body region 124, the source conductive layer 5, and the S/D region 125 have the same electric potential with respect to the corresponding contact 71. Moreover, the metallic layer 7 in the instant embodiment is an integral structure formed of Al—Si—Cu alloy, but is not limited thereto.

Figure 10:
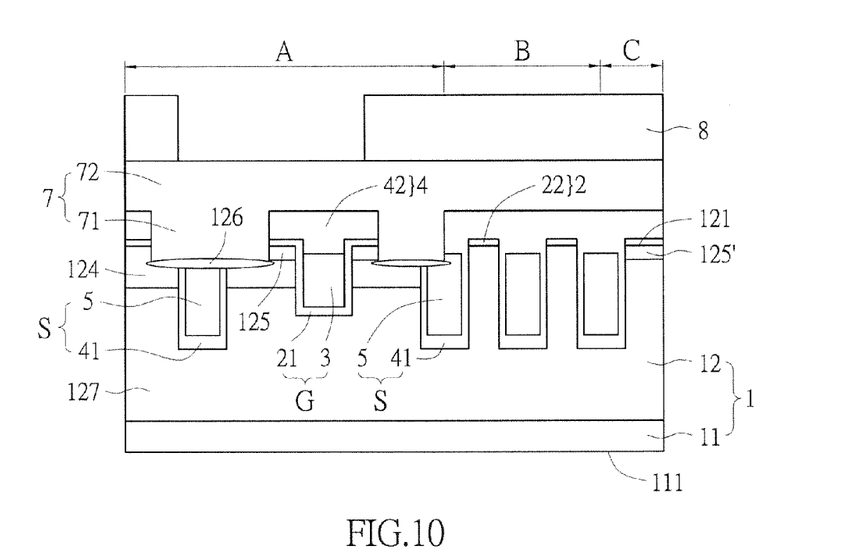
FIG. 10 is a cross-sectional view of the manufacturing method of the trench power device according to the step S190 of the first embodiment of the instant disclosure.

Step S190: as shown in FIG. 10, depositing a passivation 8 on the metallic layer 7, and then etching the passivation 8 to expose part of the metallic layer 7 arranged in the cell area A. The passivation 8 in the instant embodiment takes the oxide layer (e.g., silica layer) for example, but the oxide layer can be replaced by similar material (e.g., nitride layer). Moreover, the exposed part of the metallic layer 7 is the projecting portion of the metallic layer 7 defined by orthogonally projecting from the gate conductive layer 3 and the source conductive layer 5.

Figure 11:
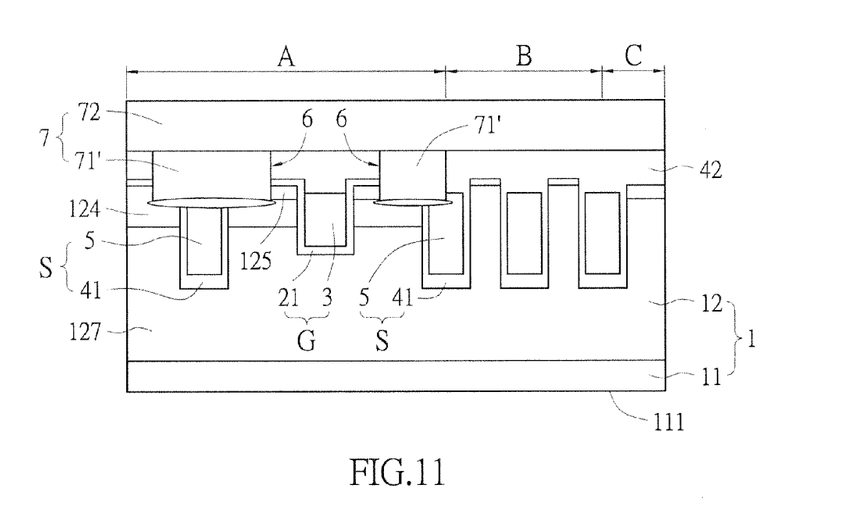
FIG. 11 is a cross-sectional view of the manufacturing method of the trench power device according to the step S180' of the first embodiment of the instant disclosure.

The trench power device as shown in FIG. 10 is manufactured by implanting the above steps S100 to S190, but each step can be replaced with reasonable variety step. For example, please refer to FIG. 11, which shows a step S180 changed from the step S180. In the step S180', depositing two contacts 71' respectively in the contact slots 6, causing the top surface of each contact 71' coplanar with the top surface of the second covering layer 42, and then depositing a conductive layer 72 on the contacts 71' and the second covering layer 42. Each contact 71' is preferably formed of tungsten, the conductive layer 72 is preferably formed of Al—Si—Cu alloy, and the contacts 71' and the conductive layer 72 are jointly defined as the metallic layer 7.

Figure 12:
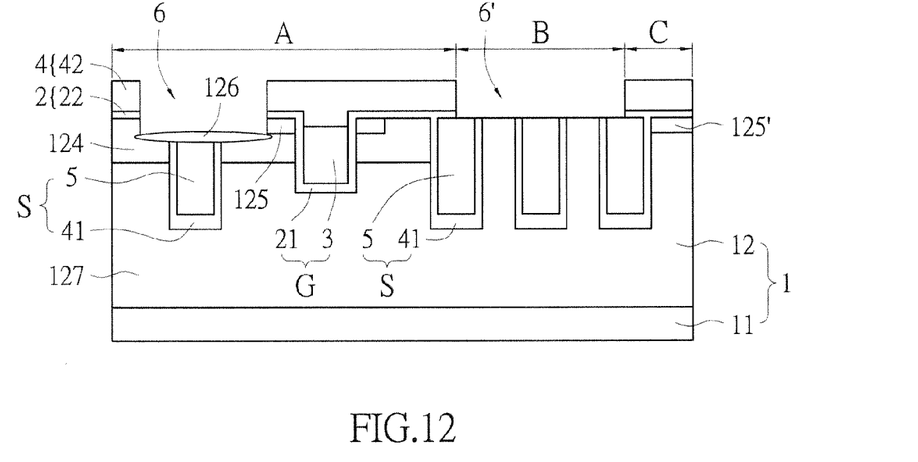
FIG. 12 is a cross-sectional view of the manufacturing method of the trench power device according to the step S170" of the first embodiment of the instant disclosure.
Figure 13:
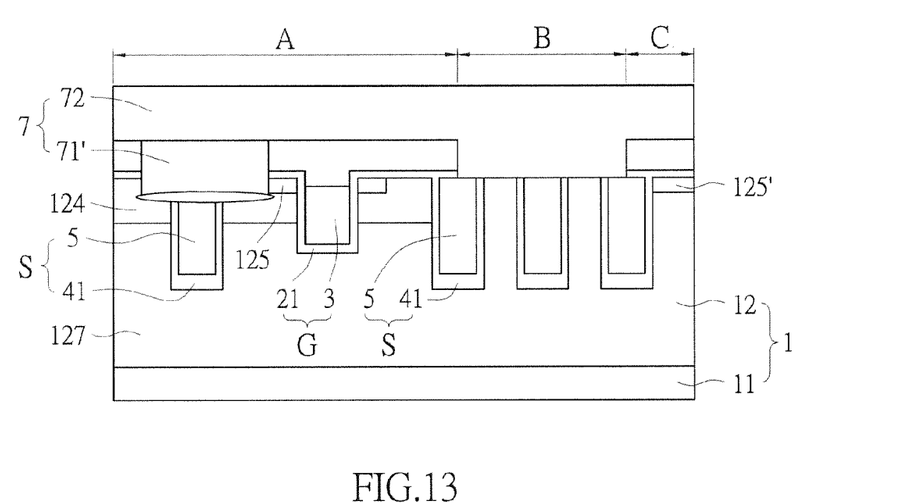
FIG. 13 is a cross-sectional view of the manufacturing method of the trench power device according to the step S180" of the first embodiment of the instant disclosure.

Additionally, please refer to FIGS. 12 and 13, which show a step S170" as shown in FIG. 12 changed from the step S170 and a step S180" as shown in FIG. 13 changed from the step S180'.

In the step S170", etching the cell area A to form a contact slot 6 by removing part of the second insulating layer 4, part of the first covering layer 22, part of the doped body region 124, and part of the source conductive layer 5, and simultaneously etching the terminal area B to form a contact slot 6' by removing part of the second insulating layer 4, part of the first covering layer 22, and part of the source conductive layer 5.

The contact slots 6, 6' are respectively arranged on two opposite sides of the gate conductive layer 3 (i.e., the left side and the right side of the gate conductive layer 3). The contact slot 6 arranged in the cell area A exposes the corresponding doped body region 124, the corresponding S/D region 125, and the corresponding source conductive layer 5. The contact slot 6' arranged in the terminal area B exposes the corresponding source conductive layers 5.

After that, implementing an ion implanting process on the bottom wall of the contact slot 6 to form a doped contact-carrying region 126. The implanted ion of the Step S170" to from the doped contact-carrying region 126 is B⁺.

In the step S180", depositing a contact 71' in the contact slot 6 arranged in the cell area A, causing the top surface of the contact 71' coplanar with the top surface of the second covering layer 42, and then depositing a conductive layer 72 on the contact 71', the second covering layer 42, and the contact slot 6' arranged in the terminal area B. Thus, the terminal area B of the trench power device includes the trench MOS barrier Schottky (TMBS) structure for increasing the switching ratio of the trench power device.

The above description has been disclosed the steps of the manufacturing method of the trench power device according to the cross-sectional views of the trench power device. The instant disclosure can be formed with any possible layout if achieving the above steps. That is to say, if observing from the top view of the trench power device, the trench power device can be adjusted from a plurality of different arrangements.

The following description discloses the structural features of the trench power device as shown in FIG. 10, and the description mainly focuses on the cell area A of the trench power device because the other structural features of the trench power device is disclosed in the above step description.

The trench power device includes a platy base 1, a trench gate structure G, at least one trench source structure S, and at least one contact 71. The trench gate structure G and the trench source structure S are embedded in the base 1, and the bottom portion of the contact 71 is embedded in the base 1 and connected to the trench source structure S.

The base 1 defines a cell area A, a terminal area B, and a channel stop area C, and the terminal area B is arranged between the cell area A and the channel stop area C. The base 1 includes a platy substrate 11 and a semiconductor layer 12 formed on the substrate 11. The bottom portion of the substrate 11 is used for connecting a drain wire (not shown). The cell area A of the semiconductor layer 12 includes an epitaxial layer 127, a doped body region 124, a S/D region 125, and two doped contact-carrying regions 126.

Specifically, the epitaxial layer 127 is disposed on the substrate 11, and the conductivity type of the epitaxial layer 127 is identical to the conductivity type of the substrate 11. The epitaxial layer 127 is used to be a drain of transistor. The doped body region 124 is connected to the epitaxial layer 127, and the doped body region 124 is arranged in the cell area A and away from the substrate 11. The conductivity type of the doped body region 124 (i.e., P type) is different from the conductivity type of the epitaxial layer 127 (i.e., N type). The S/D region 125 is connected to the doped body region 124 and the S/D region 125 is arranged in the cell area A and away from the substrate 11. That is to say, the S/D region 125 and the epitaxial layer 127 are separated by the doped body region 124. The doped contact-carrying region 126 includes a periphery portion connected to the doped body region 124 and an intermediate portion non-connected to the doped body region 124. The doped contact-carrying region 126 is approximately arranged outside a projecting portion defined by orthogonally projecting from the S/D region 125 to the doped body region 124.

The trench gate structure G is embedded in the semiconductor layer 12 arranged in the cell area A. In particular, the trench gate structure G passes through the S/D region 125 and the doped body region 124 and extends into the epitaxial layer 127. Specifically, the trench gate structure G includes a gate insulating layer 21 and a gate conductive layer 3. The gate insulating layer 21 has a groove construction and the outer surface of the gate insulating layer 21 is connected to the epitaxial layer 127, the doped body region 124, and the S/D region 125. The gate conductive layer 3 is arranged in a space surroundingly defined by the gate insulating layer 21, and the top surface of the gate conductive layer 3 is lower than the surface of the semiconductor layer 12 away from the substrate 11 (i.e., the second surface 121).

Moreover, please refer to the most-left trench source structure S of FIG. 10. The trench source structure S is embedded in the semiconductor layer 12 arranged in the cell area A, and the trench source structure S is arranged apart from the trench gate structure G. The trench source structure S passes through the doped body region 124 and extends into the epitaxial layer 127. The top portion of the trench source structure S away from the substrate 11 (i.e., the top surface of the trench source structure S) is connected to the intermediate portion of the doped contact-carrying region 126. The depth of the trench source structure S in reference to the epitaxial layer 127 is greater than the depth of the trench gate structure G in reference to the epitaxial layer 127.

Specifically, the trench source structure S includes a source insulating layer 41 and a source conductive layer 5. The source insulating layer 41 has a groove construction and the outer surface of the source insulating layer 41 is connected to the epitaxial layer 127, the doped body region 124, and the intermediate portion of the doped contact-carrying region 126. The thickness of the source insulating layer 41 is greater than the thickness of the gate insulating layer 21. The permittivity of the source insulating layer 41 is substantially equal to the permittivity of the gate insulating layer 21. The source conductive layer 5 is arranged in a space surroundingly defined by the source insulating layer 41. The top surface of the source conductive layer 5 is connected to the intermediate portion of the doped contact-carrying region 126 and lower than the top surface of the gate conductive layer 3.

The contact 71 is at least partially (i.e., the bottom portion of the contact 71 as shown in FIG. 10) arranged in a space jointly defined by the S/D region 125, the doped body region 124, and the doped contact-carrying region 126, and the contact 71 is connected to the S/D region 125, the doped body region 124, and the doped contact-carrying region 126. Thus, the electric potential of the S/D region 125 in reference to the contact 71 is identical to the electric potential of the doped body region 124 in reference to the contact 71 via the doped contact-carrying region 126. Moreover, the electric potential of the S/D region 125 in reference to the contact 71 is also identical to the electric potential of the trench source structure S in reference to the contact 71 via the doped contact-carrying region 126.

Figure 14A:
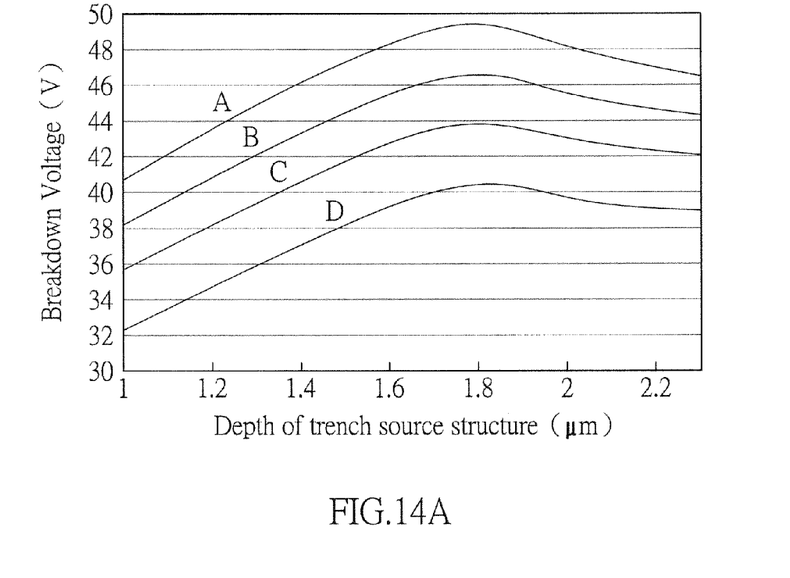
FIG. 14A is a simulating diagram of the trench power device, showing the breakdown voltage of the trench power device to the depth of trench source structure.
Figure 14B:
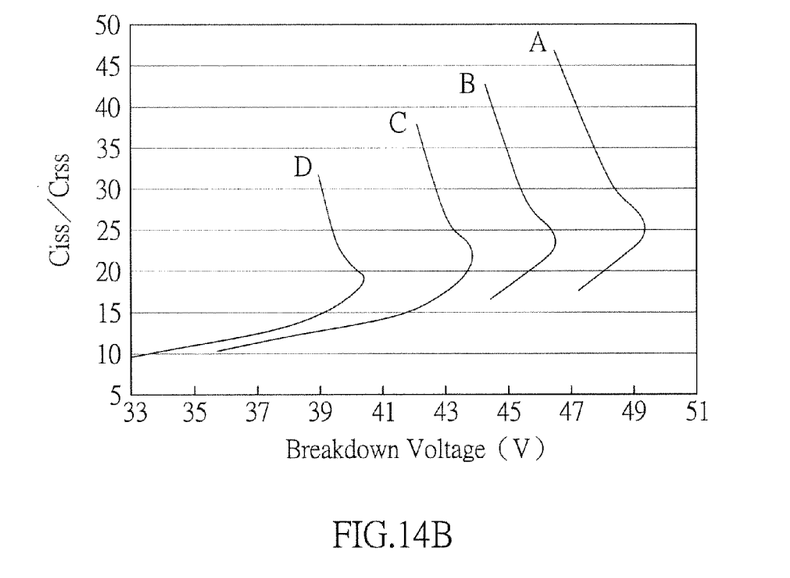
FIG. 14B is a simulating diagram of the trench power device, showing $C_{iss}/C_{rss}$ of the trench power device to the breakdown voltage of the trench power device.

Please refer to FIGS. 14A and 14B, which show the simulating diagrams of the trench power device according to the instant embodiment. The lines A, B, C, and D respectively present the trench power devices having different EPI resistivity, and the EPI resistivity presented by the lines A, B, C, and D gradually reduce. Please refer FIG. 14A, which shows that when the depth of the trench source structure S is 1.8 μm, the breakdown voltage presented by the lines A, B, C, and D is approximately 49~40 voltage, accordingly FIG. 14B shows the $C_{iss}/C_{rss}$ presented by the lines A, B, C, and D is approximately 25~20. In the objective simulating test, the trench power device of the instant embodiment capable of better $C_{iss}/C_{rss}$. Thus, when the drain of the trench power device has noise, the influence of noise to gate can be effectively reduced by increasing $C_{iss}/C_{rss}$ of the trench power device.

In addition, in theory, the depth of the trench source structure S is greater than the depth of the trench gate structure G, such that the trench source structure S is closer to the drain wire with respect to the trench gate structure G, thereby having shielding effect for reducing $C_{rss}$ of the trench power device. Moreover, the depth of the trench source structure S is greater than the depth of the trench gate structure G, so that the trench power device is configured to have larger electric field and larger breakdown voltage for improving the resistance ($R_{DS}$) between drain and source of the trench power device.

Second Embodiment

Figure 15:
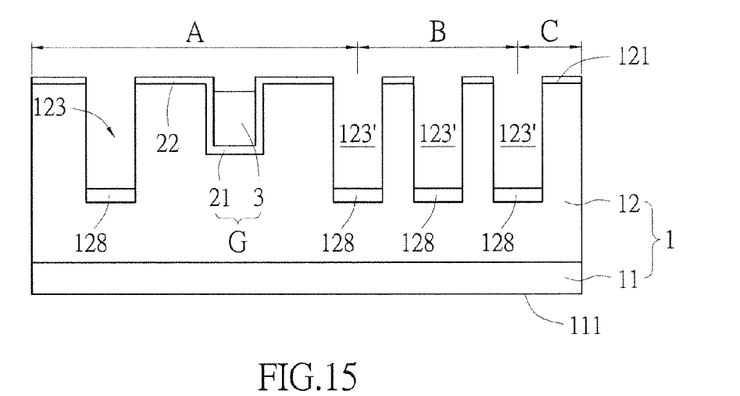
FIG. 15 is a cross-sectional view of the manufacturing method of the trench power device according to the step S230 of a second embodiment of the instant disclosure.

Please refer to FIG. 15, which shows a second embodiment of the instant disclosure. The instant embodiment is similar to the first embodiment, such that the instant embodiment does not disclose the same features, and the main difference is the step S230 of the instant embodiment, which is implemented after the step S130 of the first embodiment.

Step S230: as shown in FIG. 15, implementing an ion implanting process on the bottom wall of each deep trench 123, 123' to form a bottom doped region 128. The implanted ion of the step S230 is As⁺. After that, continuing to implement the steps S140~S190 to form the structure as shown in FIG. 16.

Figure 16:
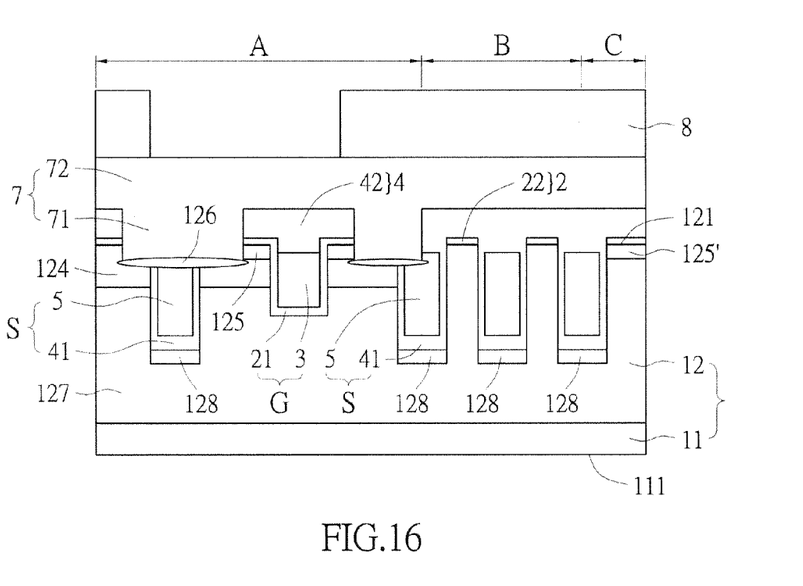
FIG. 16 is a cross-sectional view of the trench power device according to the second embodiment of the instant disclosure.

Please refer to the structural feature of the cell area A as shown in FIG. 16, the bottom doped region 128 arranged in the cell area A is connected to a portion of the trench source structure S away from the contact 71 (i.e., the bottom surface of the trench source structure S), and the conductivity type of the bottom doped region 128 is identical to the conductivity type of the epitaxial layer 127. The conductivity type of the bottom doped region 128 in the instant embodiment is N type. Thus, the instant embodiment can resist the J-FET effect generated from the trench power device by the bottom doped region 128.

Third Embodiment

Figure 17:
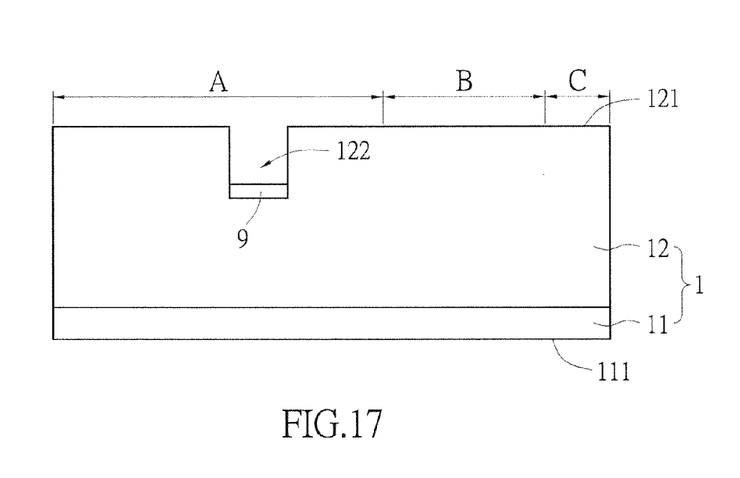
FIG. 17 is a cross-sectional view of the manufacturing method of the trench power device according to the step S310 of a third embodiment of the instant disclosure.

Please refer to FIG. 17, which shows a third embodiment of the instant disclosure. The instant embodiment is similar to the first embodiment, such that the instant embodiment does not disclose the same features, and the main difference is the step S310 of the instant embodiment, which is implemented after the step S110 of the first embodiment.

Figure 18:
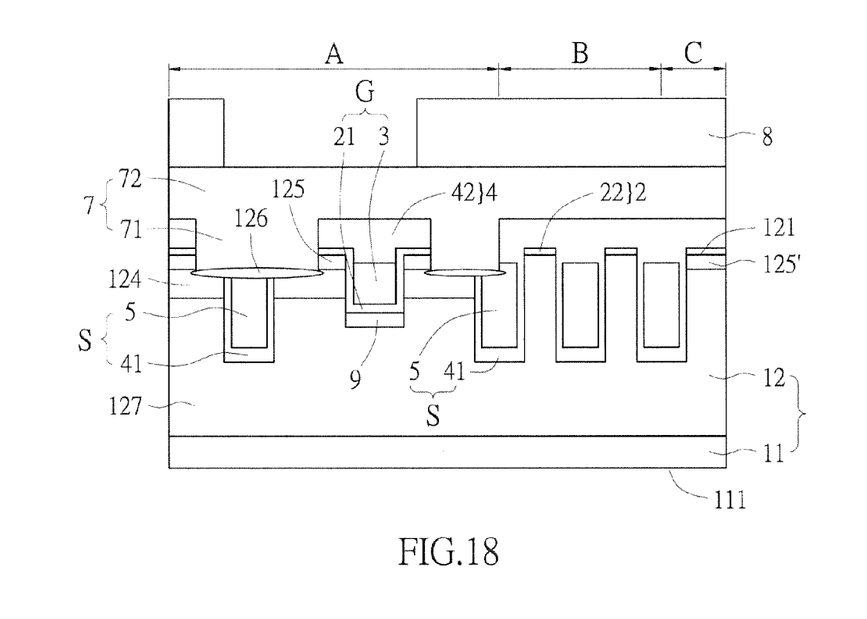
FIG. 18 is a cross-sectional view of the trench power device according, to the third embodiment of the instant disclosure.

Step S310: as shown in FIG. 17, depositing a high density plasma (HDP) insulating layer 9 on the bottom wall of the shallow trench 122, in particular, the HDP oxide layer. The thickness of the HDP insulating layer 9 is approximately 0.15 μm to 0.2 μm. After that, continuing to implement the steps S120~S190 to form the structure as shown in FIG. 18. Moreover, the thickness of the HDP insulating layer 9 is greater than the thickness of the gate insulating layer 21.

Please refer to the structural feature of the cell area A as shown in FIG. 18, the HDP insulating layer 9 is embedded in the epitaxial layer 127. The HDP insulating layer 9 arranged in the cell area A is connected to the bottom portion of the gate insulating layer 21. Moreover, the depth of the trench source structure S in reference to the epitaxial layer 127 is greater than the depth of the HDP insulating layer 9 in reference to the epitaxial layer 127. Thus, the instant embodiment can effectively reduce a parasitic capacitance ($C_{gd}$) generated between gate and drain of the trench power device by the HDP insulating layer 9.

The Possible Effects of the Instant Embodiment

In summary, the trench power device can be prepared by the manufacturing method of the trench power device. The trench power device of the instant disclosure has better performance (e.g., reducing the influence of noise to gate) by the trench gate structure and the trench source structure in parallel arrangement, the depth of the trench source structure greater than the depth of the trench gate structure, and the equipotential doped body region, source conductive layer, and S/D region 1 with respect to the corresponding contact. The trench power device of the instant disclosure is easier to be manufactured than the conventional power device.

Moreover, the terminal area of the trench power device includes the TMBS structure for increasing the switching ratio of the trench power device by forming the two contact slots at different areas (i.e., the cell area and the terminal area).

In addition, the instant embodiment can resist the J-FET effect generated from the trench power device by doping the bottom wall of each deep trench to form the bottom doped region, which having the conductivity type identical to the conductivity type of the epitaxial layer.

Additionally, the instant embodiment can effectively reduce the parasitic capacitance ($C_{gd}$) generated between gate and drain of the trench power device by depositing the HDP insulating layer on the bottom wall of the shallow trench.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A trench power device, comprising:
   a base defining a cell area, a terminal area, and a channel stop area, the terminal area arranged between the cell area and the channel stop area, wherein the base includes a substrate and a semiconductor layer formed on the substrate, and the semiconductor layer comprises:
      an epitaxial layer disposed on the substrate, the conductivity type of the epitaxial layer identical to the conductivity type of the substrate;
      a doped body region connected to the epitaxial layer, the doped body region arranged in the cell area and away from the substrate, the conductivity type of the doped body region different from the conductivity type of the epitaxial layer;
      a S/D region connected to the doped body region, the S/D region arranged in the cell area and away from the substrate; and
      a doped contact-carrying region having a periphery portion connected to the doped body region and an intermediate portion non-connected to the doped body region, the doped contact-carrying region approximately arranged outside a projecting portion defined by orthogonally projecting from the S/D region to the doped body region;
   a trench gate structure embedded in the semiconductor layer arranged in the cell area, the trench gate structure passing through the S/D region and the doped body region and extended into the epitaxial layer;
   a trench source structure embedded in the semiconductor layer arranged in the cell area, the trench source structure arranged apart from the trench gate structure, the trench source structure passing through the doped body region and extended into the epitaxial layer, wherein a top portion of the trench source structure away from the substrate is connected to the intermediate portion of the doped contact-carrying region, the depth of the trench source structure in reference to the epitaxial layer is greater than the depth of the trench gate structure in reference to the epitaxial layer; and
   a contact at least partially arranged in a space jointly defined by the S/D region and the doped contact-carrying region, the contact connected to the S/D region and the doped contact-carrying region;
   wherein the electric potential of the S/D region in reference to the contact is identical to the electric potential of the doped body region in reference to the contact via the doped contact-carrying region, and the electric potential of the S/D region in reference to the contact is identical to the electric potential of the trench source structure in reference to the contact via the doped contact-carrying region.

2. The trench power device according to claim 1, wherein the trench gate structure includes a gate insulating layer and a gate conductive layer, the gate insulating layer has a groove construction and the outer surface of the gate insulating layer is connected to the epitaxial layer, the doped body region, and the S/D region, the gate conductive layer is arranged in a space surroundingly defined by the gate insulating layer, a top surface of the gate conductive layer is lower than a surface of the semiconductor layer away from the substrate.

3. The trench power device according to claim 2, wherein the trench source structure includes a source insulating layer and a source conductive layer, the source insulating layer has a groove construction and the outer surface of the source insulating layer is connected to the epitaxial layer, the doped body region, and the intermediate portion of the doped contact-carrying region, the source conductive layer is arranged in a space surroundingly defined by the source insulating layer, a top surface of the source conductive layer is connected to the intermediate portion of the doped contact-carrying region and lower than the top surface of the gate conductive layer.

4. The trench power device according to claim 3, wherein the thickness of the source insulating layer is greater than the thickness of the gate insulating layer, the permittivity of the source insulating layer is substantially equal to the permittivity of the gate insulating layer.

5. The trench power device according to claim 1, wherein the semiconductor layer further comprising a bottom doped region, the bottom doped region is arranged in the cell area and connected to a portion of the trench source structure away from the contact, the conductivity type of the bottom doped region is identical to the conductivity type of the epitaxial layer.

6. The trench power device according to claim 2, further comprising a high density plasma (HDP) insulating layer embedded in the epitaxial layer, wherein the HDP insulating layer is arranged in the cell area and connected to a bottom portion of the gate insulating layer, the thickness of the HDP insulating layer is greater than the thickness of the gate insulating layer.

7. The trench power device according to claim 6, wherein the depth of the trench source structure in reference to the epitaxial layer is greater than the depth of the HDP insulating layer in reference to the epitaxial layer.

* * * * *